US012744373B2

(12) United States Patent
Lu et al.

(10) Patent No.: US 12,744,373 B2
(45) Date of Patent: Sep. 22, 2026

(54) ANTI-EXPLOSION ELECTRONIC DEVICE AND METHOD THEREOF

(71) Applicant: WINMATE INC., New Taipei City (TW)

(72) Inventors: Ku-Ching Lu, New Taipei City (TW); Wei-Wen Yang, New Taipei City (TW); Hsin-Chin Wang, New Taipei City (TW); Cheng-Ming Wang, New Taipei City (TW)

(73) Assignee: WINMATE INC., New Taipei City (TW)

(*) Notice: Subject to any disclaimer, the term of this patent is extended or adjusted under 35 U.S.C. 154(b) by 120 days.

(21) Appl. No.: 18/966,868

(22) Filed: Dec. 3, 2024

(65) Prior Publication Data

US 2026/0155646 A1 Jun. 4, 2026

(51) Int. Cl.

*H02H 5/08* (2006.01)
*H02H 5/04* (2006.01)
*H05K 5/00* (2025.01)

(52) U.S. Cl.

CPC ................ *H02H 5/08* (2013.01); *H02H 5/04* (2013.01); *H05K 5/0086* (2013.01)

(58) Field of Classification Search

CPC ........... H02H 5/04; H02H 5/08; H05K 5/0086
USPC .......................................................... 361/103
See application file for complete search history.

(56) References Cited

U.S. PATENT DOCUMENTS

2013/0208437 A1* 8/2013 Balle ........................ G01K 1/08 361/807
2018/0029257 A1* 2/2018 Surinya ................... B29C 39/02
2021/0184489 A1* 6/2021 Tan .......................... F16K 31/04
2022/0200271 A1* 6/2022 Lee .................. H04W 52/0277
(Continued)

FOREIGN PATENT DOCUMENTS

CN 207475659 U * 6/2018
CN 113632301 A * 11/2021 .......... H01M 50/204
JP 3763703 B2 * 4/2006 ......... H01R 13/6315

OTHER PUBLICATIONS

Machine translation of Hu Chinese Patent Document CN 113632301 A Nov. 2021 (Year: 2021).*
(Continued)

*Primary Examiner* — Kevin J Comber
(74) *Attorney, Agent, or Firm* — BACON & THOMAS, PLLC

(57) ABSTRACT

An anti-explosion electronic device includes a pogo pin, a first Hall sensor, a second Hall sensor, at least one temperature sensor, at least one pressure sensor, and a processor on an anti-explosion shell. A battery slot and a battery slot cover of the anti-explosion shell may be fastened together air-tight. The first Hall sensor senses a first movement of a magnetic fastener on a slot inner wall of the battery slot and generates a first Hall signal according to the first movement. The second Hall sensor senses a second movement of a movable pin head of the pogo pin and generates a second Hall signal according to the second movement. When the processor determines the first Hall signal or the second Hall signal changes drastically, or the anti-explosion electronic device overheats or absorbs excessive pressure, the processor enters a safety mode to prevent the anti-explosion electronic device from exploding.

10 Claims, 12 Drawing Sheets

(56) References Cited

U.S. PATENT DOCUMENTS

2023/0163399 A1* 5/2023 Lu ........................ H01M 10/425
2026/0056579 A1* 2/2026 Wiedrick .............. G06F 1/1632

OTHER PUBLICATIONS

Machine translation of Huang et al. Chinese Patent Document CN 207475659 U Jun. 2018 (Year: 2018).*
Machine translation of Nakamura et al. Japanese Patent Document JP 3763703 B2 Nov. 2021 (Year: 2021).*

* cited by examiner

ANTI-EXPLOSION ELECTRONIC DEVICE AND METHOD THEREOF

BACKGROUND OF THE INVENTION

1. Field of the Invention

The present invention relates to an anti-explosion electronic device and method thereof that prevents an electronic device from igniting fire.

2. Description of the Related Art

As technology advances, computers and various electronic devices are widely used in various industries. Under certain circumstances, a consumer electronic device would need to have an anti-explosion functionality.

In an industrial environment, a user with an electronic device might expose the electronic device to oil vapor, high concentration of oxidizing gas, other types of volatile gases, and dust that are highly combustible. In such an environment, an ignition source from any object is a safety hazard carrying a risk of causing a fire or an explosion. For example, when an electronic device overheats for any reason, the heat might possibly provide enough energy to ignite and oxidize an external combustible material in contact with the electronic device, causing a fire or an explosion. The electronic device might overheat not only because of excessive power operating its system, but also because of absorbing an external impact, causing two metallic parts to overheat due to suddenly excessive friction. For instance, a battery of an electronic device and a metallic port electrically connected to the battery might overheat due to an intense friction caused by an external impact. Furthermore, when the battery and the metallic port move against each other, an electric arc might occur between the two, thus introducing a risk of the electric arc igniting the external combustible material contacting the electronic device. Due to the above reasons, when used in a volatile industrial environment, an electronic device needs a safer design to avoid the danger of igniting fire.

SUMMARY OF THE INVENTION

To avoid the danger of fire ignition, the present invention provides an anti-explosion electronic device and method thereof. The present invention makes both hardware and software improvements for reducing a risk of an electronic device igniting an external combustible material in contact with the electronic device, thus satisfying a safety requirement for being explosion-proof.

The anti-explosion electronic device of the present invention includes:

- an anti-explosion shell, having:
  - a battery slot, with:
    - a slot space, configured to contain a battery having electrodes;
    - a slot inner wall; wherein a fastener and a magnetic fastener are respectively mounted on two opposing sides of the slot inner wall, and the magnetic fastener is movably mounted on the slot inner wall; and
    - a slot opening;
  - a battery slot cover, detachably mounted on the slot opening, and having a first fastener structure and a second fastener structure; wherein the first fastener structure is configured to be fastened with the fastener of the battery slot, and the second fastener structure is configured to be fastened with the magnetic fastener of the battery slot; wherein when the battery slot cover is fastened with the slot opening of the battery slot, the slot space is sealed air-tight;
- a pogo pin, mounted on the slot inner wall of the battery slot, and having at least one movable pin head; wherein each of the at least one movable pin head has a magnetic element, and the at least one movable pin head is configured to electrically contact one of the electrodes of the battery;
- a first Hall sensor, mounted on the anti-explosion shell, facing the magnetic fastener, and configured to sense a first movement of the magnetic fastener and to generate a first Hall signal according to the first movement of the magnetic fastener;
- a second Hall sensor, mounted on the anti-explosion shell, facing the pogo pin, and configured to sense a second movement of the at least one movable pin head and to generate a second Hall signal according to the second movement of the at least one movable pin head;
- at least one temperature sensor, mounted on the anti-explosion shell, and generating a temperature signal;
- at least one pressure sensor, mounted on the anti-explosion shell, and generating a pressure signal;
- a processor, electrically connected to the pogo pin, the first Hall sensor, the second Hall sensor, the temperature sensor, and the pressure sensor;
- wherein when the processor determines that a first changing amount of the first Hall signal is greater than a first threshold or that a second changing amount of the second Hall signal is greater than a second threshold, the processor enters a safety mode;
- wherein when the processor determines that the temperature signal is greater than a temperature threshold, the processor enters the safety mode;
- wherein when the processor determines that the pressure signal is greater than a pressure threshold, the processor enters the safety mode.

The anti-explosion method of the present invention is executed by the processor of the anti-explosion electronic device, and the anti-explosion method of the present invention includes the following steps:

- receiving a temperature signal outputted from at least one temperature sensor, and receiving a pressure signal outputted from at least one pressure sensor;
- determining whether the temperature signal is greater than a temperature threshold, and when the temperature signal is greater than the temperature threshold, entering a safety mode;
- determining whether the pressure signal is greater than a pressure threshold, and when the pressure signal is greater than the pressure threshold, entering the safety mode;
- wherein when receiving a first Hall signal from a first Hall sensor, determining whether a first changing amount of the first Hall signal is greater than a first threshold, and when the first changing amount is greater than the first threshold, entering the safety mode;
- wherein when receiving a second Hall signal from a second Hall sensor, determining whether a second changing amount of the second Hall signal is greater than a second threshold, and when the second changing amount is greater than the second threshold, entering the safety mode.

By fastening the battery slot cover with the slot opening of the battery slot, the slot space is sealed air-tight. As such, even if the battery in the slot space overheats as a heat source or produces an electric arc due to an external impact, the sealed air-tightness of the slot space prevents the heat source or the electric arc from contacting flammable gas or combustible dust outside of the battery slot cover, thus a hazard of fire ignition is avoided because of the sealed air-tightness of the slot space.

Moreover, by having the first hall sensor in the present invention, when the magnetic fastener on the slot inner wall moves, such as when a user of the present invention moves the magnetic fastener to open the battery slot cover for changing the battery, the magnetic fastener would change a magnetic field that is being sensed by the first Hall sensor. By having the second hall sensor in the present invention, when the at least one movable pin head of the pogo pin is suddenly compressed due to an external impact, the magnetic element of the at least one movable pin head would move and change a magnetic field that is being sensed by the second Hall sensor.

As such, when the processor determines that the first changing amount of the first Hall signal, or rather the magnetic field change that is sensed by the first Hall sensor, is greater than the first threshold, the processor enters the safety mode. When the processor determines that the second changing amount of the second Hall signal, or rather the magnetic field change that is sensed by the second Hall sensor is greater than the second threshold, the processor also enters the safety mode. Once the processor enters the safety mode, the processor operates the anti-explosion electronic device with safer parameters to reduce a risk of igniting fire. For example, upon entering the safety mode, the processor may reduce an operating frequency of the anti-explosion electronic device's operating system, or the processor may simply cut off power for extra protection.

By having the at least one temperature sensor and the at least one pressure sensor, the present invention may also enter the safety mode when the anti-explosion electronic device is having overtemperature or excessive pressure. These additional protection features further reduce a risk of igniting fire, thus making the anti-explosion electronic device safer and more explosion-proof.

DETAILED DESCRIPTION OF THE INVENTION

The present invention provides an anti-explosion electronic device and method thereof.

Figure 1:
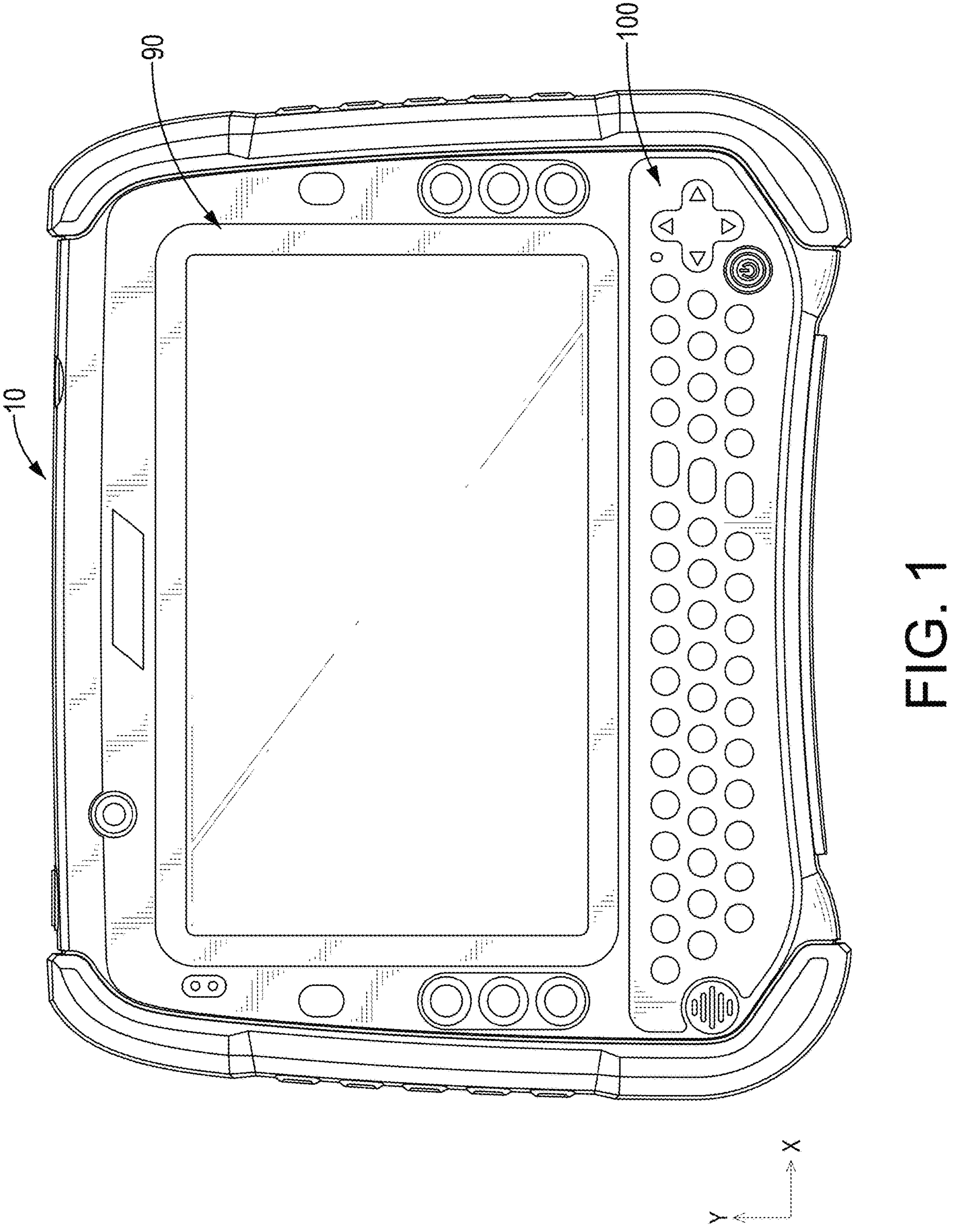
FIG. 1 is a perspective view of an anti-explosion electronic device of the present invention.
Figure 2A:
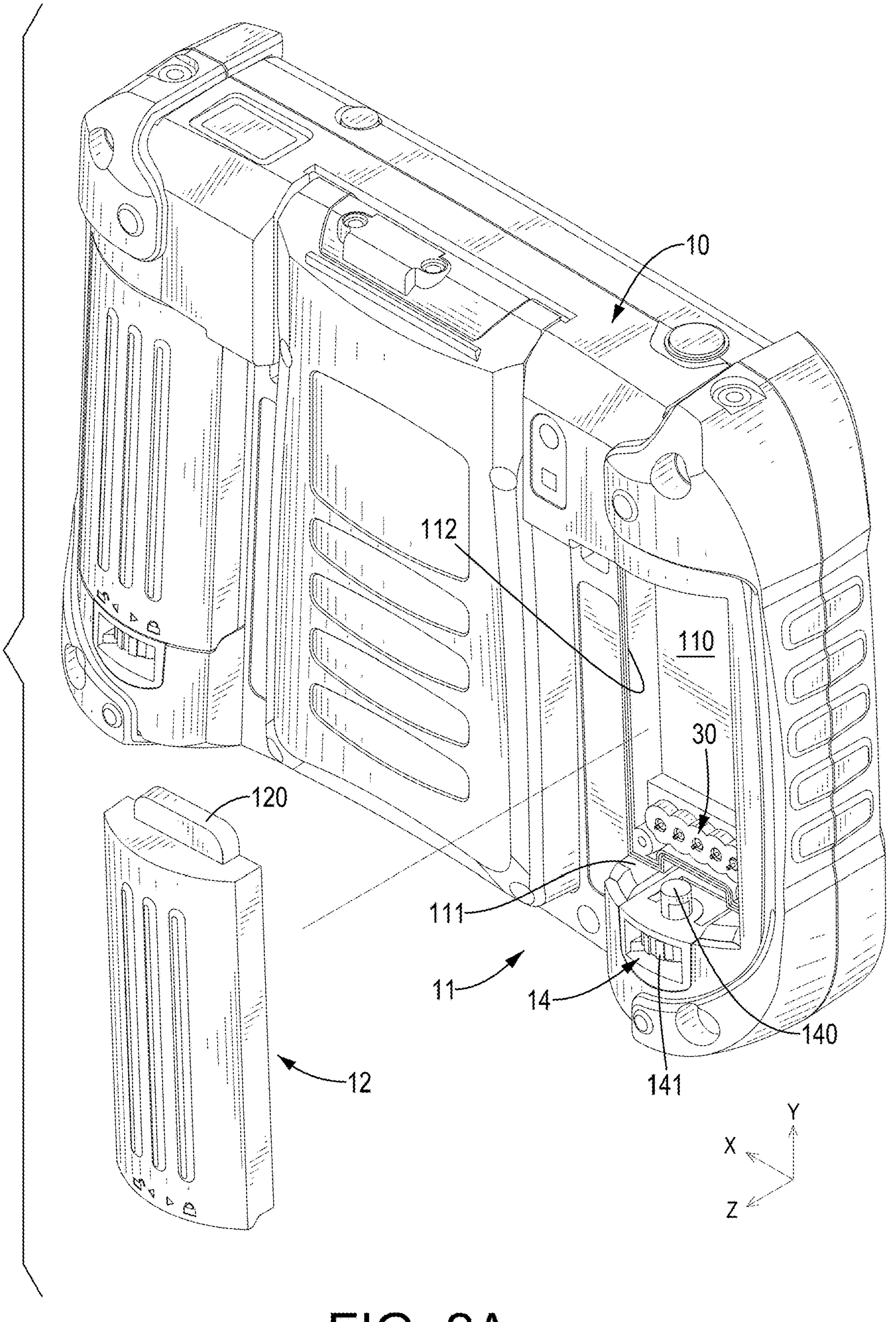
FIGS. 2A to 2B are other perspective views of the anti-explosion electronic device of the present invention.
Figure 2B:
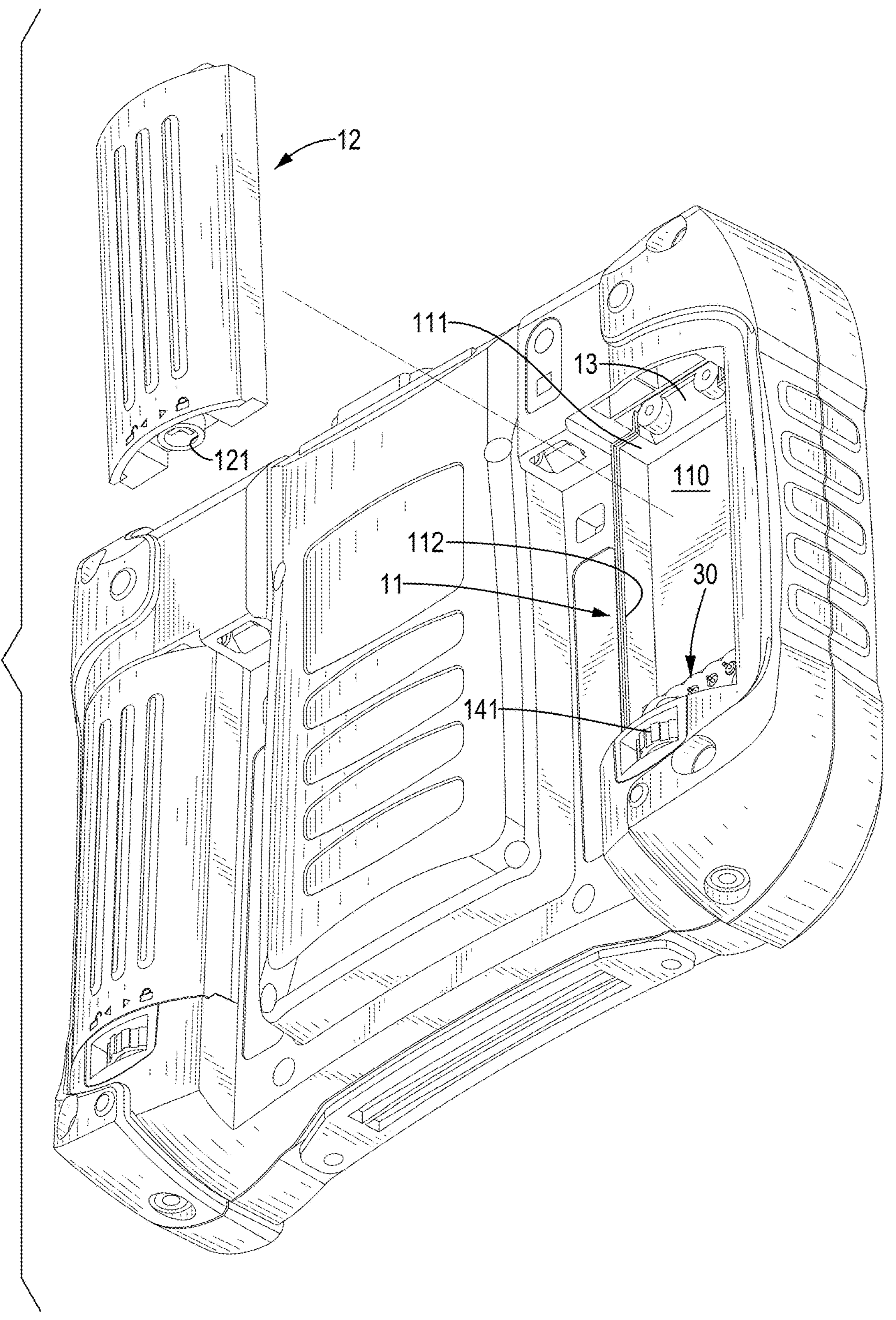

With references to FIGS. 1, 2A, and 2B, FIG. 1 shows a front side of the anti-explosion electronic device of the present invention, and FIGS. 2A and 2B show a back side of the anti-explosion electronic device. The anti-explosion electronic device of the present invention includes an anti-explosion shell 10. The anti-explosion shell 10 is located on the back side of the anti-explosion electronic device, and the anti-explosion shell 10 includes a battery slot 11 and a battery slot cover 12. The battery slot 11 includes a slot space 110, a slot inner wall 111, and a slot opening 112.

The slot space 110 is configured to contain a battery (omitted in figures) to be used by the anti-explosion electronic device. The slot inner wall 111 has two opposite sides, and a fastener 13 and a magnetic fastener 14 are respectively mounted on the two opposite sides. The magnetic fastener 14 is movably mounted on the slot inner wall 111, and in an embodiment of the present invention, the magnetic fastener 14 includes a magnetic bolt 140 and a rotatable nut 141.

Figure 3A:
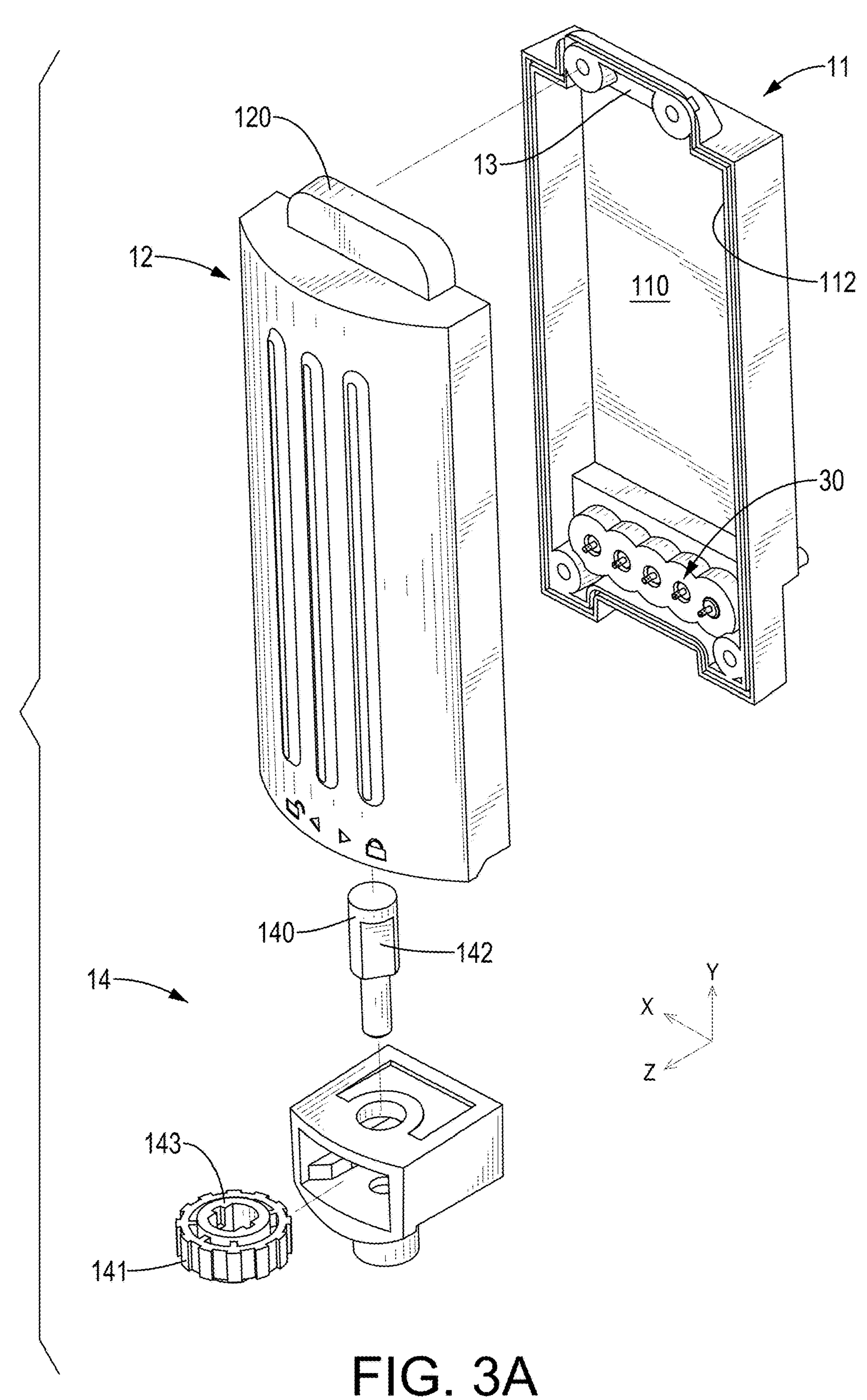
FIGS. 3A to 3B are perspective views of a battery slot and a battery slot cover of the anti-explosion electronic device of the present invention.
Figure 3B:
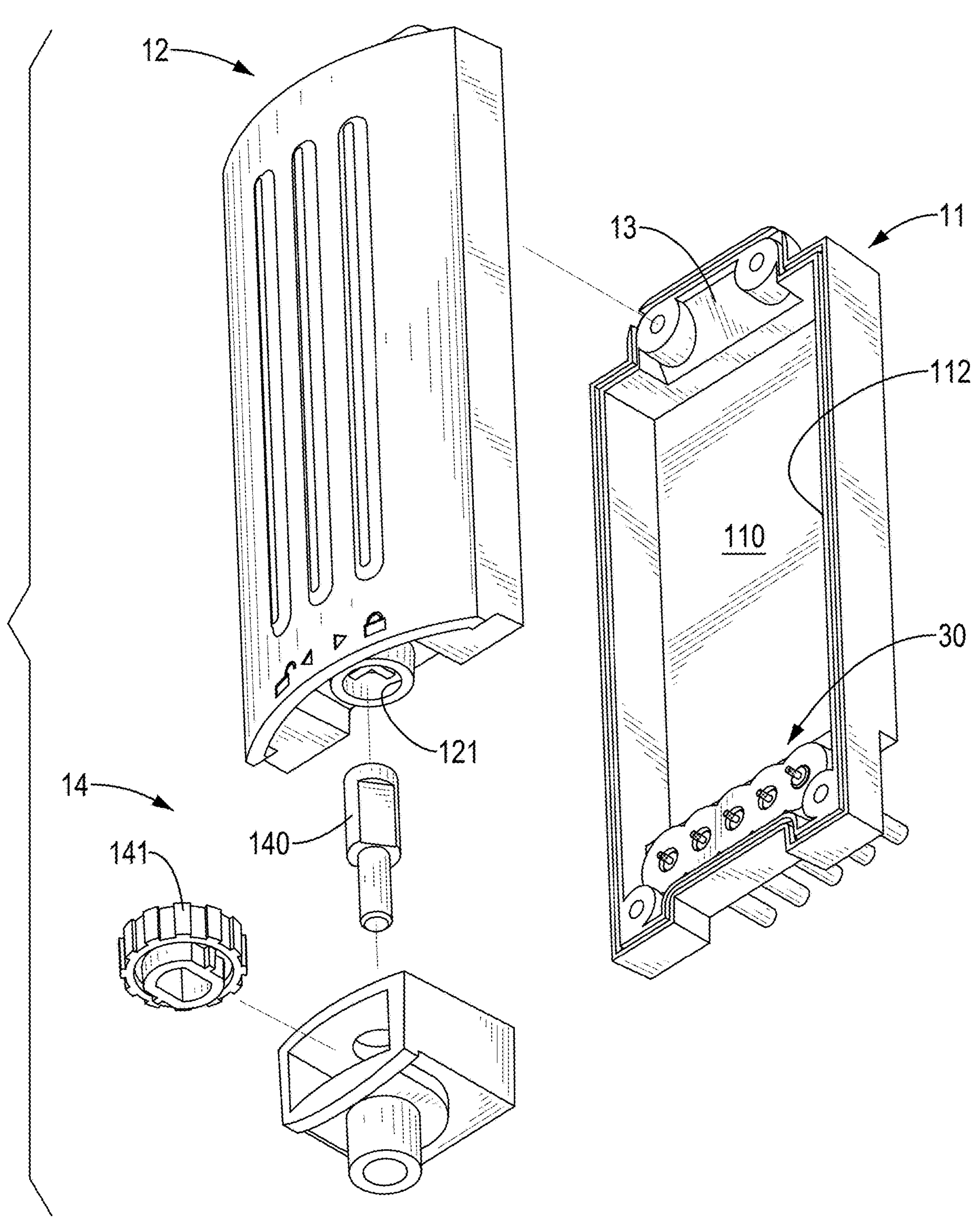

With references to FIG. 3A and FIG. 3B, an outer surface of the magnetic bolt 140 has an outer thread 142, and an inner surface of the rotatable nut 141 has an inner thread 143. The inner thread 143 and the outer thread 142 are configured to fit with each other so that the rotatable nut 141 detachably fits outside of the magnetic bolt 140 and surrounds the magnetic bolt 140. When the rotatable nut 141 rotates along a first axis Y, the magnetic bolt 140 moves along the first axis Y.

The battery slot cover 12 is detachably mounted on the slot opening 112. The battery slot cover 12 has a first fastener structure and a second fastener structure. The first fastener structure is configured to be fastened with the fastener 13 of the battery slot 11, and the second fastener structure is configured to be fastened with the magnetic fastener 14 of the battery slot 11. When the first fastener structure is fastened with the fastener 13 of the battery slot 11, and the second fastener structure is fastened with the magnetic fastener 14 of the battery slot 11, the battery slot cover 12 is fastened with the slot opening 112 of the battery slot 11, thus allowing the slot space 110 to be sealed air-tight.

More particularly, the battery slot cover 12 has two opposing surfaces, and the two opposing surfaces respectively have a protruding structure 120 and a groove structure 121 formed thereon. The protruding structure 120 is the first fastener structure, and the groove structure 121 is the second fastener structure. The fastener 13 on the slot inner wall 111 is a fastener groove, and thus the fastener 13 is configured to fasten with the protruding structure 120 of the battery slot cover 12. On the other hand, the magnetic bolt 140 of the magnetic fastener 14 on the slot inner wall 111 is mounted corresponding to the groove structure 121 of the battery slot cover 12. As such, the magnetic bolt 140 is configured to move along the first axis Y and move into the groove structure 121, for fixing the battery slot cover 12 onto the battery slot 11 together with the fastener 13 on the slot inner wall 111 and the protruding structure 120 of the battery slot cover 12. Furthermore, when the magnetic bolt 140 moves along the first axis Y and moves into the groove structure

121, the battery slot cover 12 and the battery slot 11 are fastened together to seal the slot space 110 air-tight.

By fastening and sealing the battery slot cover 12 into the slot opening 112 of the battery slot 11, even if the battery configured to be in the slot space 110 produces heat or an electric arc due to an external impact, then the heat and the electric arc are air-tightly sealed in the slot space 110 without contacting flammable gas or combustible dust outside of the battery slot cover 12. Such a technical feature ensures that when the anti-explosion electronic device is in use, the battery resting in the slot space 110 is sealed therein without igniting fire due to volatile external environment factors.

Figure 4:
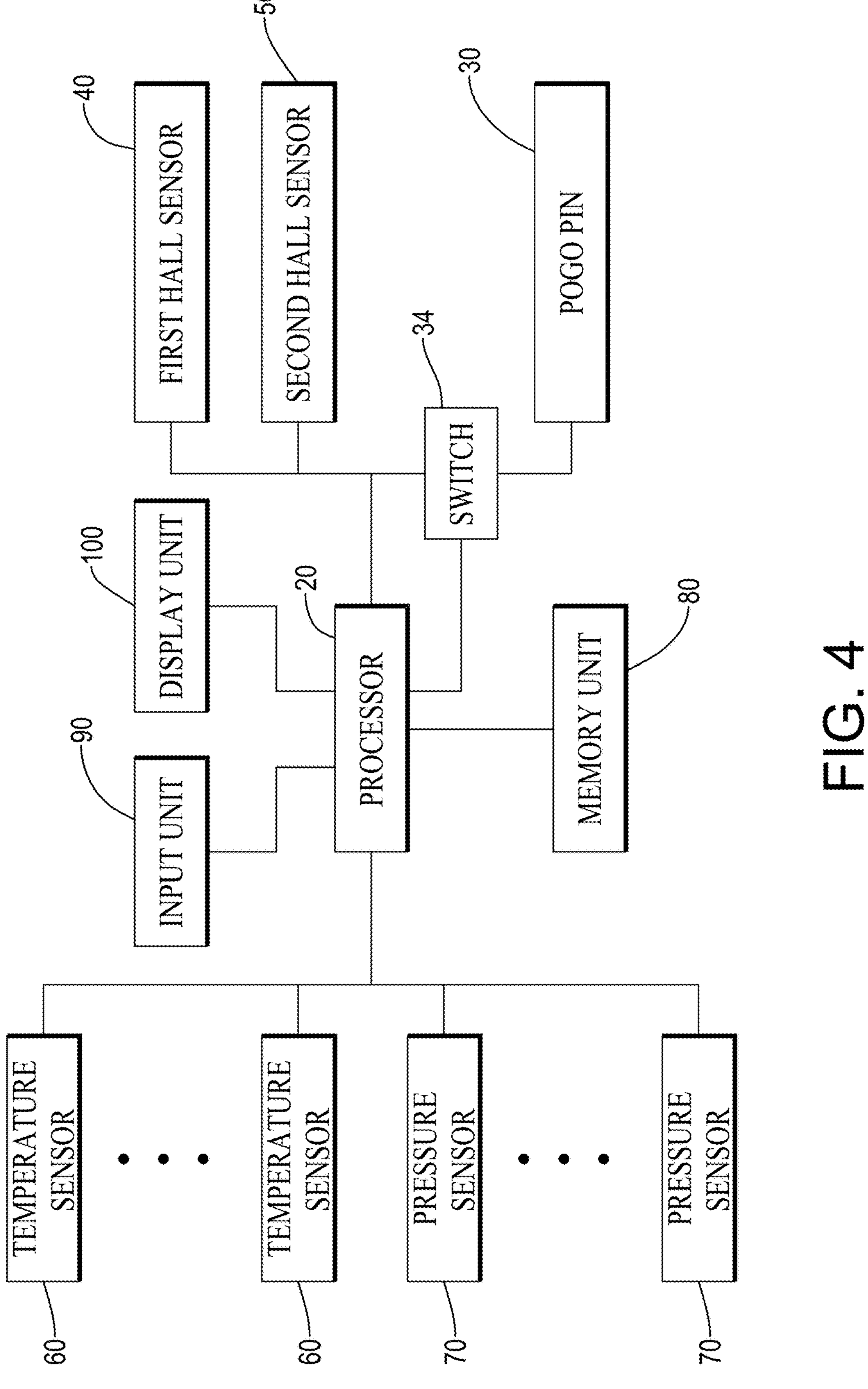
FIG. 4 is a block diagram of the anti-explosion electronic device of the present invention.
Figure 5:
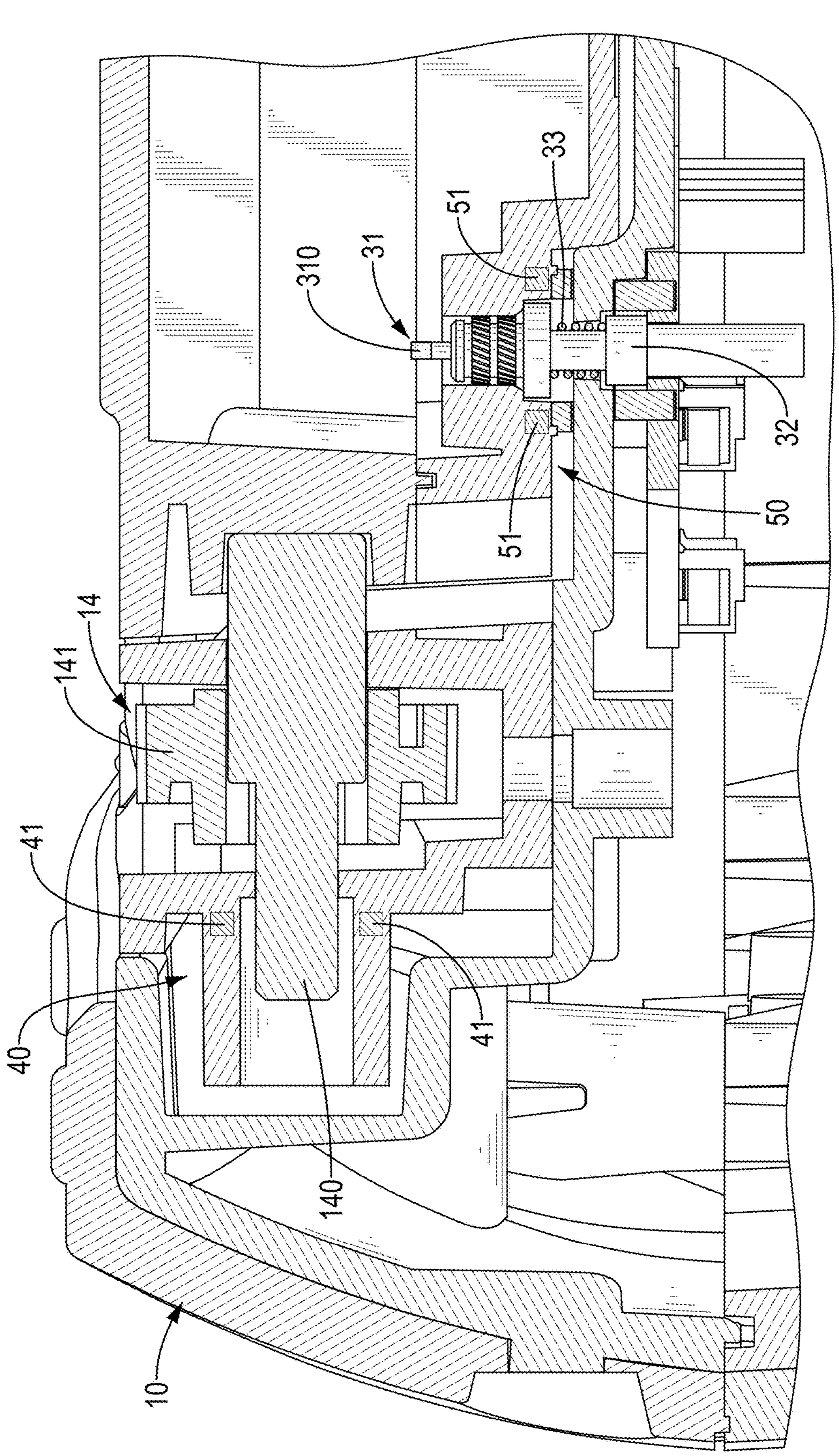
FIG. 5 is a cross-sectional perspective view of the anti-explosion electronic device of the present invention.

With references to FIG. 4 and FIG. 5, in the present embodiment, the present invention further includes a processor 20, a pogo pin 30, a first Hall sensor 40, a second Hall sensor 50, a plurality of temperature sensors 60, a plurality of pressure sensors 70, a memory unit 80, an input unit 90, and a display unit 100. The processor 20 is respectively electrically connected to the pogo pin 30, the first Hall sensor 40, the second Hall sensor 50, the temperature sensors 60, the pressure sensors 70, the memory unit 80, the input unit 90, and the display unit 100.

The pogo pin 30 is mounted on the slot inner wall 111 of the battery slot 11. The pogo pin 30 has a plurality of pins. Each of the pins includes a movable pin head 31, a base 32, and a spring 33. Each movable pin head 31 further includes a magnetic element 310. For each of the pins 30, the movable pin head 31, the base 32, and the spring 33 are electrically connected to each other, and the base 32 is further electrically connected to the processor 20. In the present embodiment, the battery used by the anti-explosion electronic device includes a plurality of electrodes (not shown), and the movable pin heads 31 of the pogo pin 30 are configured to electrically contact the electrodes of the battery. Each of the movable pin heads 31 is magnetic for having the magnetic element 310. For example, the magnetic element 310 of each of the movable pin heads 31 is a magnetic coating layer coated on each of the movable pin heads 31.

The spring 33 is mounted on the base 32, and the spring 33 is mounted along a second axis Z and mounted between the base 32 and the movable pin head 31. In other words, when the spring 33 compresses or stretches, the movable pin head 31 moves along the second axis Z. Moreover, when the movable pin head 31 is being pushed towards the base 32 by an external force, the spring 33 is being compressed. An extend of how much the spring 33 is compressed may be gauged by a distance remaining between the movable pin head 31 and the base 32.

For example, when the spring 33 is slightly compressed, the distance remaining between the movable pin head 31 and the base 32 is at a first distance. When the spring 33 is being moderately compressed, the distance remaining between the movable pin head 31 and the base 32 is at a second distance. When the spring 33 is severely compressed, the distance remaining between the movable pin head 31 and the base 32 is at a third distance. The first distance is greater than the second distance, and the second distance is greater than the third distance. Such a change of distance between the movable pin head 31 and the base 32 corresponds to a change of electrical pathway length for the movable pin head 31 to send an electrical signal to the processor 20 through the base 32. Therefore, when the movable pin head 31 and the base 32 are at the first distance, the processor 20 takes a longer time to receive the electrical signal outputted from the movable pin head 31. Vice versa, when the movable pin head 31 and the base 32 are at the third distance, the processor 20 takes a shorter time to receive the electrical signal outputted from the movable pin head 31. This difference in signal transportation time from the movable pin head 31 to the processor 20 would be further explored in later parts of the detailed description for the present invention.

The first Hall sensor 40 is mounted on the anti-explosion shell 10 and faces the magnetic fastener 14. The first Hall sensor 40 is configured to sense a first movement of the magnetic bolt 140 of the magnetic fastener 14 moving along the first axis Y, to generate a first Hall signal according to the first movement of the magnetic fastener 14, and to send the first Hall signal to the processor 20. More particularly, the first Hall sensor 40 includes a first coil 41, and the first coil 41 coils along the first axis Y on the anti-explosion shell 10. When the magnetic bolt 140 of the magnetic fastener 14 moves, for instance, when a user of the present invention moves the magnetic bolt 140 of the magnetic fastener 14 in order to open the battery slot cover 12 for battery change, the magnetic bolt 140 would change a magnetic field that is being sensed by the first coil 41 of the first Hall sensor 40; in other words, the magnetic bolt 140 would change an amount of magnetic flux going through the first coil 41 of the first Hall sensor 40. In response to such a change in magnetic field strength, the first Hall signal generated by the first Hall sensor 40 would experience a first changing amount.

The second Hall sensor 50 is also mounted on the anti-explosion shell 10, and the second Hall sensor 50 faces the pogo pin 30. The second Hall sensor 50 is configured to sense a second movement of at least one of the movable pin heads 31, to generate a second Hall signal according to the second movement, and to send the second Hall signal to the processor 20. More particularly, the second Hall sensor 50 includes a second coil 51, and the second coil 51 coils along the second axis Z on the anti-explosion shell 10. When at least one of the movable pin heads 31 of the pogo pin 30 moves abruptly due to an impact, thus compressing the spring 33 and moving the magnetic element 310, the magnetic element 310 in moving motion would change a magnetic field that is being sensed by the second coil 51 of the second Hall sensor 50; in other words, the moving magnetic element 310 would change an amount of magnetic flux going through the second coil 51 of the second Hall sensor 50. In response to such a change in magnetic field strength, the second Hall signal generated by the second Hall sensor 50 would experience a second changing amount.

In another embodiment, the second Hall sensor 50 may include a plurality of the second coils 51. Each of the second coils 51 only corresponds to one of the movable pin heads 31 of the pogo pin 30. Similarly, when any one of the movable pin heads 31 moves, the second Hall sensor 50 would be able to generate the second Hall signal in response to the magnetic field change sensed by one of the second coils 51.

The temperature sensors 60 and the pressure sensors 70 are both mounted on different parts of the anti-explosion shell 10. Each of the temperature sensors 60 senses a temperature to generate a temperature signal and sends the temperature signal to the processor 20. Each of the pressure sensors 70 senses a pressure to generate a pressure signal and sends the pressure signal to the processor 20.

The memory unit 80 stores multiple threshold parameters, such as a first threshold, a second threshold, a duration time threshold, a changing difference threshold, a changing duration time threshold, a temperature threshold, and a pressure threshold.

When the processor 20 receives the first Hall signal from the first Hall sensor 40, the processor 20 determines whether the first changing amount of the first Hall signal is greater than the first threshold stored in the memory unit 80. When the processor 20 receives the second Hall signal from the second Hall sensor 50, the processor 20 determines whether the second changing amount of the second Hall signal is greater than the second threshold stored in the memory unit 80. Each time when the processor 20 receives the temperature signal from one of the temperature sensors 60, the processor 20 determines whether the temperature signal is greater than the temperature threshold stored in the memory unit 80. Each time when the processor 20 receives the pressure signal from one of the pressure sensors 70, the processor 20 determines whether the pressure signal is greater than the pressure threshold stored in the memory unit 80.

When the processor 20 determines that the first changing amount of the first Hall signal is greater than the first threshold or the second changing amount of the second Hall signal is greater than the second threshold, the processor 20 enters a safety mode. Furthermore, when the processor 20 determines that the temperature signal is greater than the temperature threshold or the pressure signal is greater than the pressure threshold, the processor 20 also enters the safety mode.

When the first changing amount of the first Hall signal is greater than the first threshold, that is to say, the battery slot cover 12 is thus about to move and lose its air-tight seal on the battery of the anti-explosion electronic device. When the second changing amount of the second Hall signal is greater than the second threshold, the anti-explosion electronic device is thus possibly generating heat or the electric arc from the battery absorbing an impact along the second axis Z. When the temperature signal is greater than the temperature threshold, a position thereon the anti-explosion shell 10 is experiencing overtemperature. When the pressure signal is greater than the pressure threshold, a position thereon the anti-explosion shell 10 is experiencing excessive pressure due to possibly absorbing the impact. Under these circumstances, an electronic device would theoretically be in greater risk of exploding, and therefore the electronic device should function with safer parameters under the safety mode. The anti-explosion electronic device that enters the safety mode runs with safer parameters to decrease a risk of igniting fire. For example, upon entering the safety mode, the processor 20 may reduce an operating frequency of the anti-explosion electronic device's operating system for decreasing a power consumption of the anti-explosion electronic device, and thus decreasing the risk of the anti-explosion electronic device exploding.

In another embodiment, a switch 34 is electrically connected between the processor 20 and the pogo pin 30. Upon entering the safety mode, the processor 20 controls the switch 34 to switch off and stop conduction, thus creating an open circuit between the processor 20 and the pogo pin 30. In other words, by powering off the anti-explosion electronic device, the anti-explosion electronic device is further prevented from exploding.

In an embodiment, the memory unit 80 may also store a low risk threshold, a moderate risk threshold, and a high risk threshold corresponding to the second changing amount of the second Hall signal. The aforementioned second threshold is the moderate threshold, and the low risk threshold is a warning threshold. The low risk threshold is less than the moderate risk threshold, and the high risk threshold is greater than the moderate risk threshold.

The processor 20 determines whether the second changing amount of the second Hall signal is respectively greater than the low risk threshold, the moderate risk threshold, and the high risk threshold.

When the second changing amount of the second Hall signal is less than or equal to the low risk threshold, the processor 20 determines that each of the movable pin heads 31 of the pogo pin 30 is merely slightly compressed, and that the distance between each of the movable pin heads 31 and the base 32 is still greater than the first distance, therefore, no warning for risk of explosion is needed.

When the second changing amount of the second Hall signal is greater than the low risk threshold, but less than or equal to the moderate risk threshold, the processor 20 determines that the distance between each of the movable pin heads 31 and the base 32 is between the first distance and the second distance; therefore, a warning for risk of explosion is needed, yet the risk of explosion still does not exceed a need to change parameters of how the anti-explosion electronic device operates.

When the second changing amount of the second Hall signal is greater than the moderate risk threshold, but less than or equal to the high risk threshold, the processor 20 determines that the distance between each of the movable pin heads 31 and the base 32 is between the second distance and the third distance; therefore, the operating frequency of the anti-explosion electronic device's operating system should be reduced to lower the risk of explosion.

When the second changing amount of the second Hall signal is greater than the high risk threshold, the processor 20 determines that the distance between each of the movable pin heads 31 and the base 32 is less than the third distance, therefore, the switch 34 must be controlled to power off the anti-explosion electronic device for maximizing an effort to lower the risk of explosion.

Apart from determining whether the second changing amount of the second Hall signal is greater than the warning threshold, the processor 20 also determines whether the first changing amount of the first Hall signal is greater than the warning threshold. When the processor 20 determines that the first changing amount of the first Hall signal or the second changing amount of the second Hall signal is greater than the warning threshold, the processor 20 starts counting a signal duration time. When the processor 20 determines that the first changing amount of the first Hall signal and the second changing amount of the second Hall signal are both less than the warning threshold, the processor 20 stops counting the signal duration time.

While counting the signal duration time, the processor 20 determines whether the signal duration time is greater than or equal to the duration time threshold stored in the memory unit 80. When the processor 20 determines that the signal duration time is greater than or equal to the duration time threshold, the processor 20 enters the safety mode.

Figure 6:
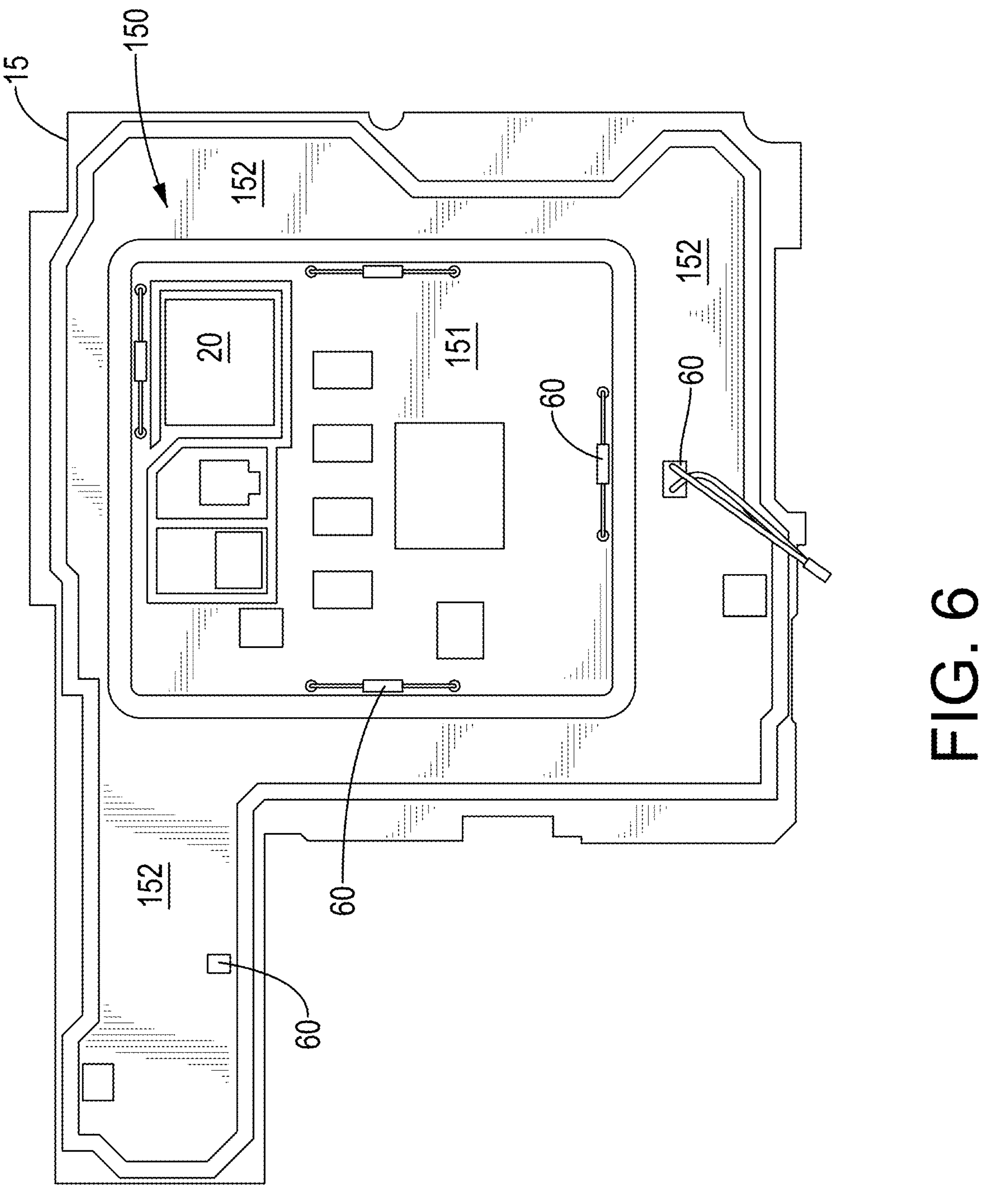
FIG. 6 is a perspective view of a circuit board of the anti-explosion electronic device of the present invention.

With reference to FIGS. 1, 2, and 6, in the present embodiment, the anti-explosion shell 10 is rectangular and has six surfaces. The front side and the back side mentioned before are two of the six surfaces that are facing the second axis Z. The input unit 90 and the display unit 100 are mounted on the front side for ease of access by the user. The first axis Y is perpendicular to the second axis Z, and the first axis Y also corresponds to another two of the six surfaces. A third axis X is perpendicular to both the first axis Y and the second axis Z, and the third axis X also corresponds to another two of the six surfaces. For a total of six pressure sensors 70, each one of the pressure sensors 70 is respectively mounted on one of the six surfaces of the anti-explosion shell 10. As a result, each of the pressure sensors 70 is able to sense a pressure of impact on one of the surfaces of the anti-explosion shell 10.

A circuit board 15 is mounted on the anti-explosion shell 10, and a circuit board surface 150 of the circuit board 15 is divided into a core area 151 and a peripheral area 152 that surrounds the core area 151. The processor 20 is mounted in the core area 151 of the circuit board surface 150, and the temperature sensors 60 are respectively mounted along a border between the core area 151 and the peripheral area 152 and mounted in the peripheral area 152. Widely scattered across the circuit board surface 150, the temperature sensors 60 are able to widely survey temperatures across the core area 151 and the peripheral area 152, thus ensuring the circuit board 15 as a whole is free from having overtemperatures.

Figure 7:
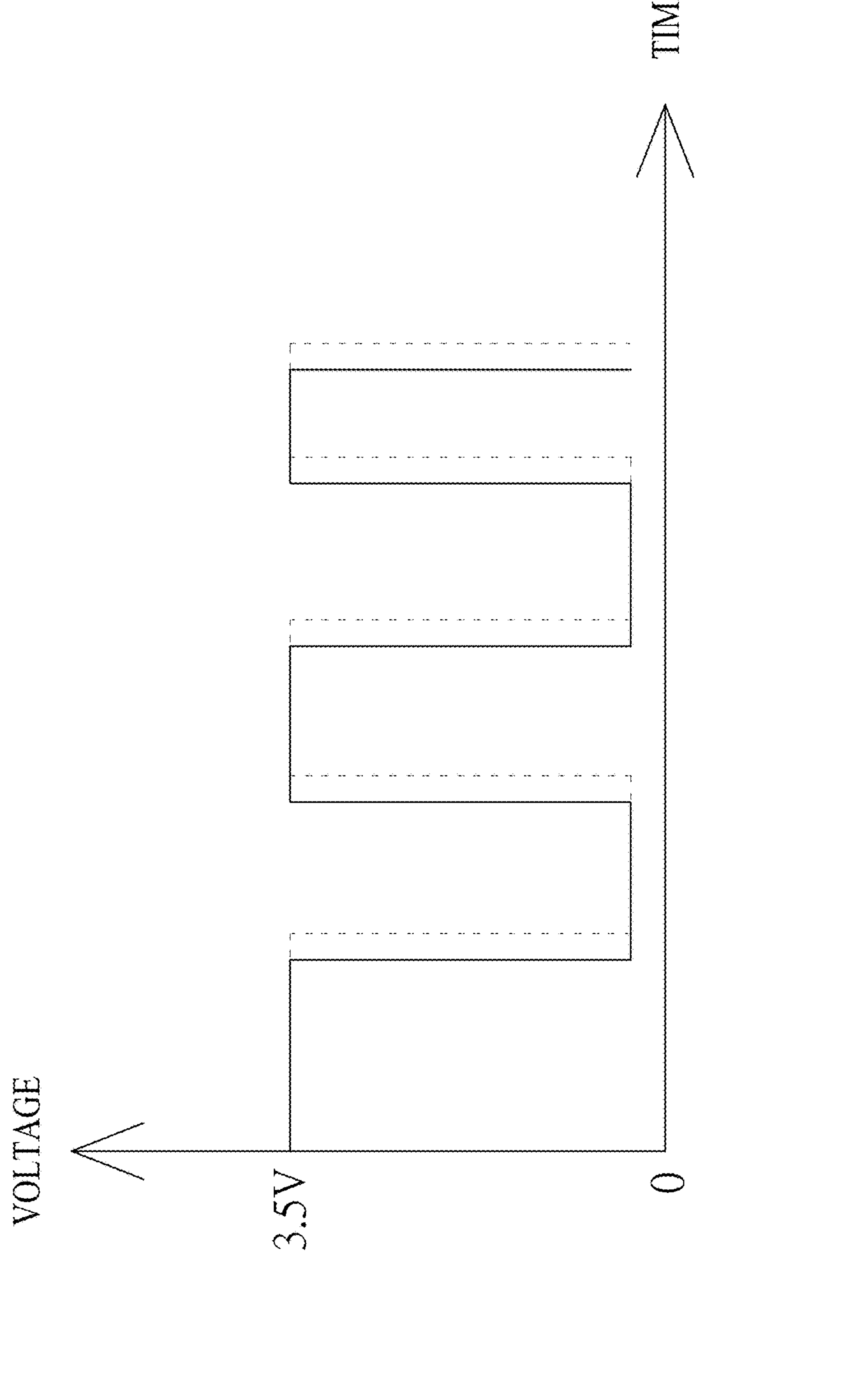
FIG. 7 is a waveform perspective view of an operational voltage value of the anti-explosion electronic device of the present invention.

With reference to FIG. 7, the processor 20 is also able to periodically measure and record an operation voltage of the processor 20 according to a default time period stored in the memory unit 80. This way the processor 20 is able to periodically determine whether the operation voltage is stable. When the processor 20 determines that the operation voltage is fluctuating and unstable, the processor 20 also enters the safety mode.

More particularly, the processor 20 will judge whether the operation voltage is stable; that is to say, the processor 20 calculates a voltage difference between two adjacent records of the operation voltage, and then the processor 20 determines whether the voltage difference is greater than the changing difference threshold stored in the memory unit 80. When the processor 20 determines that the voltage difference is greater than the changing difference threshold, the processor 20 starts counting a changing duration time. When the processor 20 determines that the voltage difference is less than or equal to the changing difference threshold, the processor 20 stops counting the changing duration time.

For example, the processor 20 stores two adjacent records of the operation voltage as a first voltage curve C1 and a second voltage curve C2 in the memory unit 80. The first voltage curve C1 represents a waveform of the operation voltage when the anti-explosion electronic device is working normally. The waveform of the first voltage curve C1 is thus evidently stably periodic. The second voltage curve C2 represents a waveform of the operation voltage when the anti-explosion electronic device is impacted. Evidently, when absorbing the impact, the waveform of the second voltage curve C2 is affected to have fluctuating and unstable periodicity, and the fluctuation in periodicity corresponds to a change in the distance between the movable pin heads 31 and the base 32 as previously mentioned. In other words, when the periodicity of the operation voltage fluctuates for some time, such as, when the periodicity of the operation voltage progressively decreases, the distance between the movable pin heads 31 and the base 32 are also continuously changing, such as, in a situation when the spring 33 is being progressively more compressed. Under such a circumstance, the pogo pin 30 is having increasing risk of igniting fire and causing an explosion, because the electrodes of the battery are scraping against the movable pin heads 31 and heat is continuously being generated from such friction.

To prevent the increasing risk of igniting fire and explosion, the processor 20 determines whether the changing duration time is greater than or equal to the changing duration time threshold stored in the memory unit 80. When the processor 20 determines the changing duration time is greater than or equal to the changing duration time threshold, the processor 20 determines that the operation voltage is unstable, and thus the processor 20 enters the safety mode as a precaution to run safer.

Figure 8:
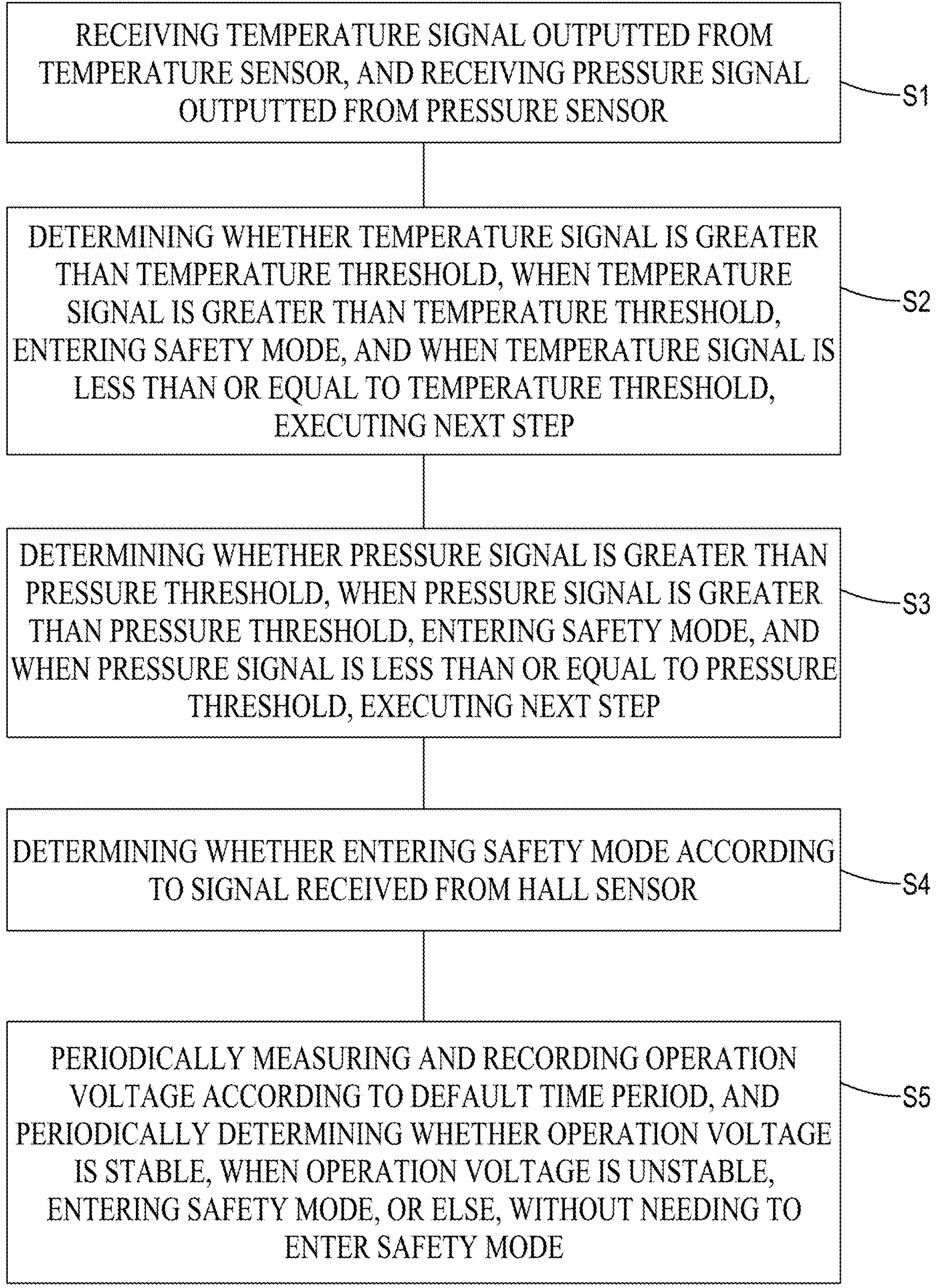
FIG. 8 is a flow chart of an anti-explosion method of the present invention.

With reference to FIG. 8, considering all of the aforementioned technical features, the present invention also provides an anti-explosion method that is executed by the processor 20 of the anti-explosion electronic device. The anti-explosion method includes the following steps:

step S1: receiving a temperature signal outputted from at least one temperature sensor, and receiving a pressure signal outputted from at least one pressure sensor;

step S2: determining whether the temperature signal is greater than a temperature threshold, when the temperature signal is greater than the temperature threshold, entering a safety mode, and when the temperature signal is less than or equal to the temperature threshold, executing next step;

step S3: determining whether the pressure signal is greater than a pressure threshold, when the pressure signal is greater than the pressure threshold, entering the safety mode, and when the pressure signal is less than or equal to the pressure threshold, executing next step;

step S4: determining whether entering the safety mode according to a signal received from a Hall sensor;

step S5: periodically measuring and recording an operation voltage according to a default time period, and periodically determining whether the operation voltage is stable, when the operation voltage is unstable, entering the safety mode, or else, without needing to enter the safety mode.

In different embodiments of the present invention, step S2 to step S5 May be executed in different combinations of orders.

Figure 9:
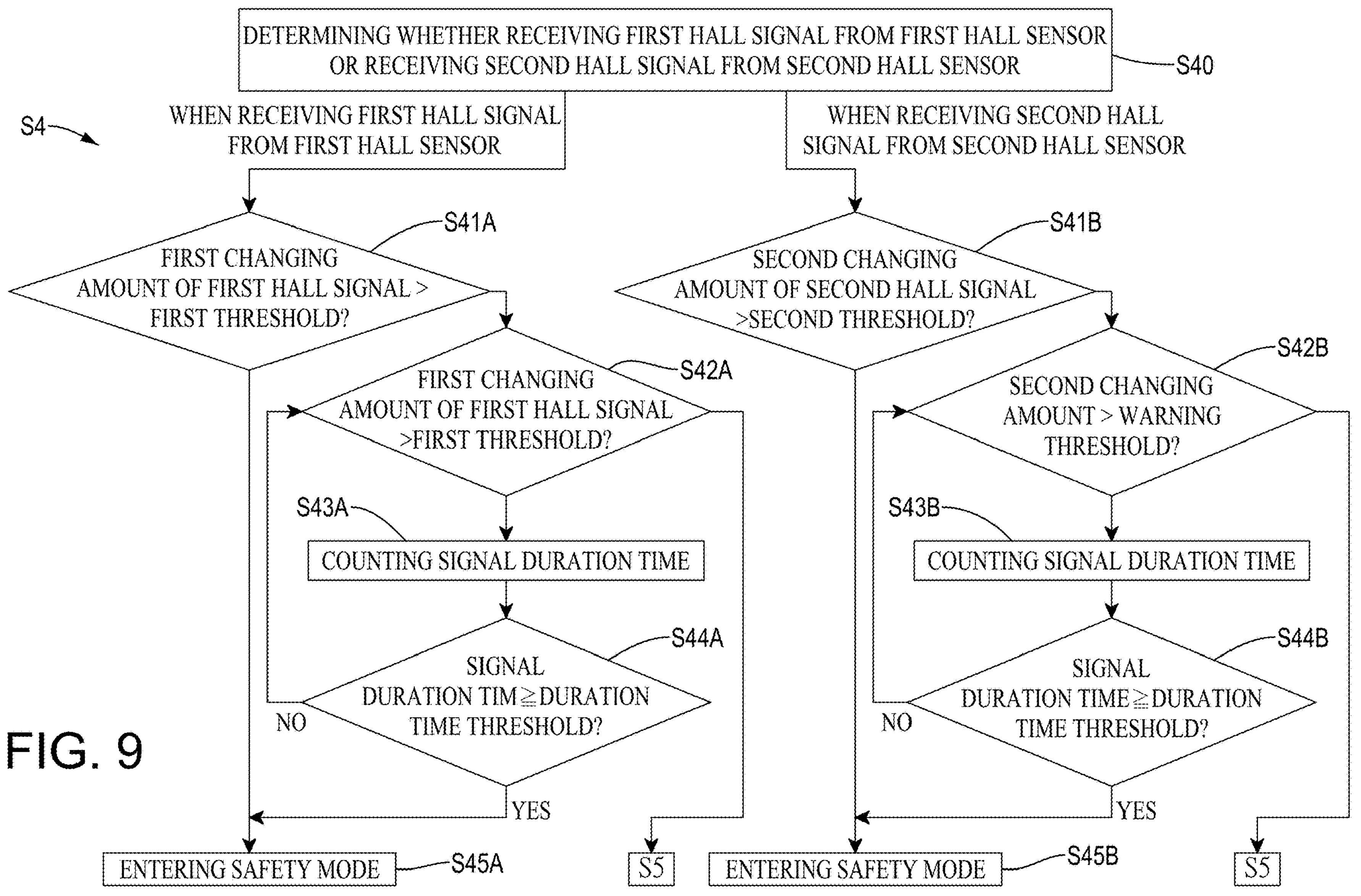
FIG. 9 is another flow chart of the anti-explosion method of the present invention.

With reference to FIG. 9, in an embodiment, step S4 further includes the following sub-steps:

step S40: determining whether receiving the first Hall signal from the first Hall sensor or receiving the second Hall signal from the second Hall sensor;

step S41A: when receiving the first Hall signal from the first Hall sensor, determining whether a first changing amount of the first Hall signal is greater than a first threshold, and when the first changing amount is greater than the first threshold, executing step S45A;

step S42A: when the first changing amount is less than or equal to the first threshold, determining whether the first changing amount of the first Hall signal is greater than a warning threshold, and when the first changing amount is less than or equal to the warning threshold, executing step S5;

step S43A: when the first changing amount is greater than the warning threshold, counting a signal duration time;

step S44A: determining whether the signal duration time is greater than or equal to a duration time threshold, when the signal duration time is greater than or equal to the duration time threshold, executing step S45A, and when the signal duration time is less than the duration time threshold, executing step S42A;

step S45A: entering the safety mode;

step S41B: when receiving the second Hall signal from the second Hall sensor, determining whether a second changing amount of the second Hall signal is greater than a second threshold, and when the second changing amount is greater than the second threshold, executing step S45B;

step S42B: when the second changing amount is less than or equal to the second threshold, determining whether the second changing amount of the second Hall signal is greater than the warning threshold, and when the second changing amount is less than or equal to the warning threshold, executing step S5;

step S43B: when the second changing amount is greater than the warning threshold, counting the signal duration time;

step S44B: determining whether the signal duration time is greater than or equal to the duration time threshold, when the signal duration time is greater than or equal to the duration time threshold, executing step S45B, and when the signal duration time is less than the duration time threshold, executing step S42B;

step S45B: entering the safety mode.

Figure 10:
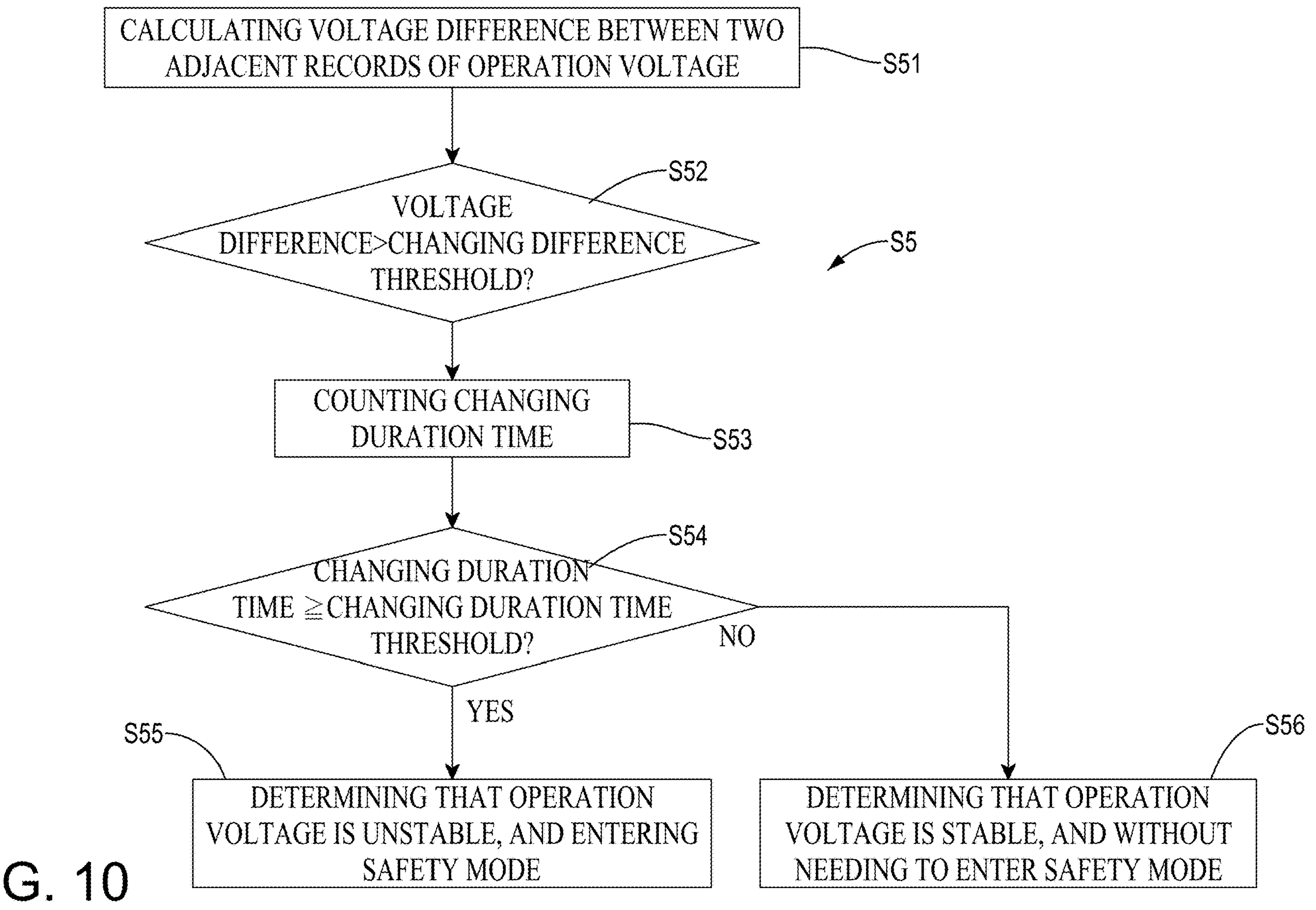
FIG. 10 is another flow chart of the anti-explosion method of the present invention.

With reference to FIG. 10, step S5 further includes the following sub-steps:

step S51: calculating a voltage difference between two adjacent records of the operation voltage;

step S52: determining whether the voltage difference is greater than a changing difference threshold;

step S53: when the voltage difference is greater than the changing difference threshold, counting a changing duration time;

step S54: determining whether the changing duration time is greater than or equal to a changing duration time threshold;

step S55: when the changing duration time is greater than or equal to the changing duration time threshold, determining that the operation voltage is unstable, and entering the safety mode;

step S56: when the changing duration time is less than the changing duration time threshold, determining that the operation voltage is stable, and without needing to enter the safety mode.

Overall, the present invention utilizes the first Hall sensor mounted for the first axis and the second Hall sensor mounted for the second axis to respectively detect the changes of the magnetic bolt and the changes of the pogo pin. The changes of both the magnetic bolt and the pogo pin are then used to determine whether the battery of the electronic device is working under normal safe conditions. When (1) the battery of the electronic device is about to be changed, (2) when the electronic device is having overtemperature therein, or (3) when the electronic device is placed in a volatile environment with high risks of causing explosions, the electronic device is able to use a Hall sensor, a temperature sensor, or a pressure sensor to change how the electronic device's system operates. By changing the operation parameters of the electronic device, such as by lowering an operation frequency of the electronic device or by powering off the electronic device, the electronic device is prevented from igniting fire and exploding.

What is claimed is:

1. An anti-explosion electronic device, comprising:

an anti-explosion shell, comprising:

a battery slot, comprising:

a slot space, configured to contain a battery having electrodes;

a slot inner wall; wherein a fastener and a magnetic fastener are respectively mounted on two opposing sides of the slot inner wall, and the magnetic fastener is movably mounted on the slot inner wall; and a slot opening;

a battery slot cover, detachably mounted on the slot opening, and comprising a first fastener structure and a second fastener structure; wherein the first fastener structure is configured to be fastened with the fastener of the battery slot, and the second fastener structure is configured to be fastened with the magnetic fastener of the battery slot; wherein when the battery slot cover is fastened with the slot opening of the battery slot, the slot space is sealed air-tight;

a pogo pin, mounted on the slot inner wall of the battery slot, and comprising at least one movable pin head; wherein each of the at least one movable pin head comprises a magnetic element, and the at least one movable pin head is configured to electrically contact one of the electrodes of the battery;

a first Hall sensor, mounted on the anti-explosion shell, facing the magnetic fastener, and configured to sense a first movement of the magnetic fastener and to generate a first Hall signal according to the first movement of the magnetic fastener;

a second Hall sensor, mounted on the anti-explosion shell, facing the pogo pin, and configured to sense a second movement of the at least one movable pin head and to generate a second Hall signal according to the second movement of the at least one movable pin head;

at least one temperature sensor, mounted on the anti-explosion shell, and generating a temperature signal;

at least one pressure sensor, mounted on the anti-explosion shell, and generating a pressure signal;

a processor, electrically connected to the pogo pin, the first Hall sensor, the second Hall sensor, the at least one temperature sensor, and the pressure sensor;

wherein when the processor determines that a first changing amount of the first Hall signal is greater than a first threshold or that a second changing amount of the second Hall signal is greater than a second threshold, the processor enters a safety mode;

wherein when the processor determines that the temperature signal is greater than a temperature threshold, the processor enters the safety mode;

wherein when the processor determines that the pressure signal is greater than a pressure threshold, the processor enters the safety mode.

2. The anti-explosion electronic device as claimed in claim 1, wherein the at least one pressure sensor is a plurality of the pressure sensors;

wherein the anti-explosion shell comprises a plurality of surfaces, and each of the surfaces of the anti-explosion shell respectively mounts one of the pressure sensors.

3. The anti-explosion electronic device as claimed in claim 1, further comprising:

a circuit board, mounted on the anti-explosion shell;

wherein a circuit board surface of the circuit board is divided into a core area and a peripheral area that surrounds the core area;

wherein the processor is mounted in the core area of the circuit board surface;

wherein the at least one temperature sensor is a plurality of said temperature sensors, and the temperature sensors are respectively mounted along a border between the core area and the peripheral area and mounted in the peripheral area.

4. The anti-explosion electronic device as claimed in claim 1, wherein the processor periodically measures and records an operation voltage according to a default time period, and periodically determines whether the operation voltage is stable; when the operation voltage is unstable, the processor enters the safety mode;

wherein when the processor periodically determines whether the operation voltage is stable, the processor calculates a voltage difference between two adjacent records of the operation voltage, and determines whether the voltage difference is greater than a changing difference threshold;

wherein when the voltage difference is greater than the changing difference threshold, the processor starts counting a changing duration time, and when the voltage difference is less than or equal to the changing difference threshold, the processor stops counting the changing duration time;

wherein the processor determines the changing duration time is greater than or equal to a changing duration time threshold, the processor determines the operation voltage is unstable.

5. The anti-explosion electronic device as claimed in claim 1, wherein the battery slot cover has two opposing surfaces, and the two opposing surfaces respectively have a protruding structure and a groove structure formed thereon, the protruding structure is the first fastener structure, and the groove structure is the second fastener structure;

wherein the fastener of the slot inner wall is a fastener groove configured to fasten with the protruding structure of the battery slot cover;

wherein the magnetic fastener on the slot inner wall comprises:

a magnetic bolt, comprising an outer surface with an outer thread, and mounted corresponding to the groove structure;

a rotatable nut, comprising an inner surface with an inner thread, and detachably fitting outside of the magnetic bolt for surrounding the magnetic bolt; wherein the rotatable nut is configured to rotate along a first axis, and when the rotatable nut rotates, the magnetic bolt moves along the first axis;

wherein when the magnetic bolt moves along the first axis and into the groove structure, the battery slot cover and the battery slot are fastened air-tight together;

wherein the first Hall sensor comprises a first coil, and the first coil coils along the first axis.

6. The anti-explosion electronic device as claimed in claim 1, wherein the magnetic element of each of the at least one movable pin head of the pogo pin is a magnetic coating layer coated on each of the at least one movable pin head;

wherein the at least one movable pin head moves along a second axis;

wherein the second Hall sensor comprises a second coil, and the second coil coils along the second axis.

7. An anti-explosion method, executed by a processor of the anti-explosion electronic device as claimed in claim 1, wherein the anti-explosion method comprises the following steps:

receiving a temperature signal outputted from at least one temperature sensor, and receiving a pressure signal outputted from at least one pressure sensor;

determining whether the temperature signal is greater than a temperature threshold, and when the temperature signal is greater than the temperature threshold, entering a safety mode;

determining whether the pressure signal is greater than a pressure threshold, and when the pressure signal is greater than the pressure threshold, entering the safety mode;

wherein when receiving a first Hall signal from a first Hall sensor, determining whether a first changing amount of the first Hall signal is greater than a first threshold, and when the first changing amount is greater than the first threshold, entering the safety mode;

wherein when receiving a second Hall signal from a second Hall sensor, determining whether a second changing amount of the second Hall signal is greater than a second threshold, and when the second changing amount is greater than the second threshold, entering the safety mode.

8. The anti-explosion method as claimed in claim 7, further comprising the following steps:

determining whether the first changing amount of the first Hall signal or the second changing amount of the second Hall signal is greater than a warning threshold;

when the first changing amount or the second changing amount is greater than the warning threshold, starting counting a signal duration time;

determining whether the signal duration time is greater than or equal to a signal duration time threshold;

when the signal duration time is greater than or equal to the signal duration time threshold, entering the safety mode.

9. The anti-explosion method as claimed in claim 7, further comprising the following steps:

periodically measuring and recording an operation voltage according to a default time period, and periodically determining whether the operation voltage is stable;

when the operation voltage is unstable, entering the safety mode.

10. The anti-explosion method as claimed in claim 9, wherein the step of periodically determining whether the operation voltage is stable, comprises the following substeps:

calculating a voltage difference between two adjacent records of the operation voltage;

determining whether the voltage difference is greater than a changing difference threshold;

when the voltage difference is greater than the changing difference threshold, counting a changing duration time;

determining whether the changing duration time is greater than or equal to a changing duration time threshold;

when the changing duration time is greater than or equal to the changing duration time threshold, determining that the operation voltage is unstable, and entering the safety mode.

* * * * *